United States Patent
Lin et al.

(10) Patent No.: US 11,143,973 B2
(45) Date of Patent: Oct. 12, 2021

(54) METHOD FOR DESIGNING PHOTOMASK

(71) Applicant: Powerchip Semiconductor Manufacturing Corporation, Hsinchu (TW)

(72) Inventors: Hsiao-Chiang Lin, New Taipei (TW); Yu-Hsuan Chang, Hsinchu County (TW); Li-Chun Tseng, Yilan County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 311 days.

(21) Appl. No.: 16/373,637

(22) Filed: Apr. 3, 2019

(65) Prior Publication Data
US 2020/0241431 A1 Jul. 30, 2020

(30) Foreign Application Priority Data
Jan. 25, 2019 (TW) .................................. 108102893

(51) Int. Cl.
*G03F 7/20* (2006.01)
*G03F 1/38* (2012.01)

(52) U.S. Cl.
CPC ............ *G03F 7/70733* (2013.01); *G03F 1/38* (2013.01); *G03F 7/70875* (2013.01)

(58) Field of Classification Search
CPC ..... G03F 1/38; G03F 1/54; G03F 1/70; G03F 7/70733; G03F 7/70875
See application file for complete search history.

(56) References Cited

U.S. PATENT DOCUMENTS

| | | | |
|---|---|---|---|
| 6,809,793 B1 | 10/2004 | Phan et al. | |
| 6,909,490 B2 | 6/2005 | Hirayanagi | |
| 9,627,326 B2 | 4/2017 | Chou et al. | |
| 2002/0142233 A1* | 10/2002 | Inoue | G03F 1/36 430/5 |
| 2010/0196829 A1 | 8/2010 | Hashimoto et al. | |
| 2010/0203299 A1* | 8/2010 | Abdallah | G03F 7/40 428/195.1 |
| 2013/0045591 A1* | 2/2013 | Shaw | H01L 21/0273 438/514 |
| 2016/0276285 A1* | 9/2016 | Chou | H01L 21/02164 |

FOREIGN PATENT DOCUMENTS

| | | |
|---|---|---|
| CN | 1320404 | 6/2007 |
| CN | 101446768 | 6/2009 |
| TW | 201030804 | 8/2010 |

OTHER PUBLICATIONS

"Office Action of Taiwan Counterpart Application," dated Nov. 12, 2019, p. 1-p. 4.

* cited by examiner

*Primary Examiner* — Peter B Kim
(74) *Attorney, Agent, or Firm* — JCIPRNET

(57) ABSTRACT

A method for designing a photomask includes calculating an open ratio of an initial photomask to determine whether the open ratio of the initial photomask is less than 25%, and then changing a design of the initial photomask in response to determining the open ratio is less than 25%, such that a changed photomask has a reverse tone to the design of the initial photomask, and an open ratio of the changed photomask is 75% or more. The method can solve the issue caused by thermal expansion of the photomask.

6 Claims, 5 Drawing Sheets

METHOD FOR DESIGNING PHOTOMASK

CROSS-REFERENCE TO RELATED APPLICATION

This application claims the priority benefit of Taiwan application serial no. 108102893, filed on Jan. 25, 2019. The entirety of the above-mentioned patent application is hereby incorporated by reference herein and made a part of this specification.

BACKGROUND

Technical Field

The disclosure relates to a semiconductor photolithography technique, and more particularly, to a method for designing a photomask and a semiconductor photolithography process.

Description of Related Art

The semiconductor photolithography process is important for the fabrication of integrated circuits, and the accuracy of the pattern size has a great influence on the yield of the product.

For example, prior to all steps of fabricating a semiconductor device, a structure such as an alignment mark is first formed on a frame region or a dicing line of the substrate. Since the size of the alignment mark here is large, exposure-development may be performed by using a KrF laser light source (with a wavelength at 248 nm).

However, in the process of using the KrF exposure technique, it is found that different machines have significantly different influences on thermal expansion of the photomask. Once the photomask undergoes thermal expansion, the position of the photomask pattern on the silicon wafer after exposure would change, which affects relevant positions of the patterns of subsequently-formed layers.

SUMMARY

The invention provides a method for designing a photomask, which can solve the issue of thermal expansion of a photomask.

The invention further provides a semiconductor photolithography process, which can reduce the size variation amount of the zero layer.

A method for designing a photomask of the invention includes the following steps. An open ratio of an initial photomask is calculated to determine whether the open ratio of the initial photomask is less than 25%. In response to determining the open ratio is less than 25%, a design of the initial photomask is changed, such that a changed photomask has a reverse tone to the design of the initial photomask, and an open ratio of the changed photomask is 75% or more.

In an embodiment of the invention, the initial photomask is adapted to expose a positive tone resist, and the changed photomask is adapted to expose a negative tone resist.

In an embodiment of the invention, before the step of calculating the open ratio of the initial photomask, it may be first confirmed whether the initial photomask is for a photolithography process of a zero layer. In response to confirming that the initial photomask is for the photolithography process of the zero layer, the calculation is performed.

In an embodiment of the invention, the zero layer includes a doping region or an etched structure.

In an embodiment of the invention, the changed photomask includes a transparent substrate and a light shielding layer disposed on the transparent substrate, and a ratio between an area of the light shielding layer and an area of the changed photomask is less than 25%.

In an embodiment of the invention, the light shielding layer is, for example, a metal layer.

A semiconductor photolithography process of the invention is adapted to form a zero layer on a substrate and includes the following steps. A negative tone resist layer is formed on the substrate. An exposure-development process is performed on the negative tone resist layer by using a photomask to define a plurality of overlapping regions in the negative tone resist layer, wherein an open ratio of the photomask is 75% or more.

In another embodiment of the invention, after the exposure-development process, a doping process may be performed on the substrate by using the negative tone resist layer as a mask to form a plurality of doping regions as the zero layer.

In another embodiment of the invention, after the exposure-development process, the substrate may be etched by using the negative tone resist layer as a mask to form a plurality of etched structures as the zero layer.

Based on the above, by changing the design of the photomask, the invention changes the initial photomask originally having a large-area light shielding layer to a photomask having a reverse tone to significantly reduce the area of the light shielding layer and increase the open ratio of the photomask to 75% or more. Therefore, in the process of performing an exposure-development process by using such a photomask, since the light shielding layer in the photomask occupies a smaller area, the influence of thermal expansion on the photomask can be reduced, and thereby the accuracy of the semiconductor photolithography process can be increased (e.g., reducing the position deviation amount of the overlapping regions.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
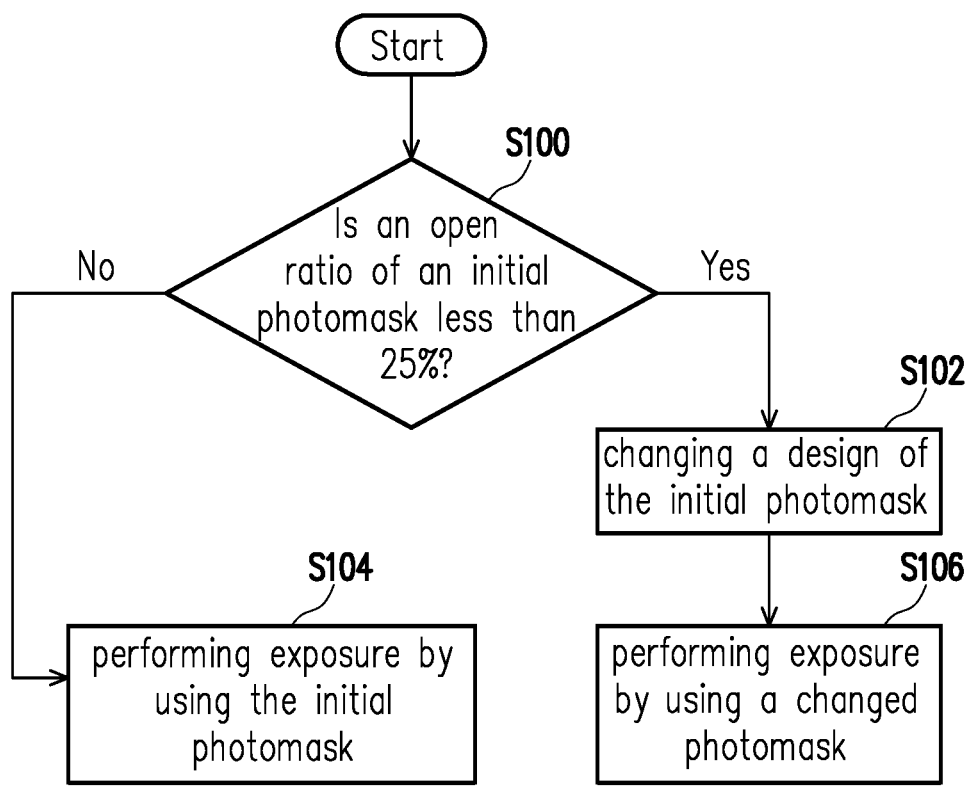
FIG. 1 is a design flowchart of a photomask according to a first embodiment of the invention.

Several embodiments are described in detail below with reference to the accompanying drawings. However, the embodiments provided herein are not intended to limit the scope of the disclosure. In addition, the drawings are for illustrative purposes only and are not illustrated according to actual dimensions. To facilitate understanding, the same elements will hereinafter be denoted by the same reference numerals. In addition, terms such as "contain," "include," "have" and the like used herein are all open terms, which mean including but not limited to. Moreover, directional terms mentioned herein, such as "on" and "below," are only directions relative to the drawings. Therefore, the directional terms are used to illustrate rather than limit the disclosure.

FIG. 1 is a design flowchart of a photomask according to a first embodiment of the invention.

Referring to FIG. 1, in step S100, it is calculated an open ratio of an initial photomask to determine whether the open ratio of the initial photomask is less than 25%. In response to determining the calculated open ratio is less than 25%, step S102 is performed. Conversely, if the calculated open ratio is 25% or more, step S104 is directly performed, and exposure is performed by using the initial photomask.

In step S102, a design of the initial photomask is changed, such that the changed photomask has a reverse tone to the design of the initial photomask, and an open ratio of the changed photomask is 75% or more. In the present embodiment, the initial photomask is adapted to expose a positive tone resist, and the changed photomask is adapted to expose a negative tone resist.

In the description herein, the term "zero layer" refers to a structure that is formed on a frame region or a dicing line of the substrate in advance before all steps of fabricating a semiconductor device, and it facilitates to subsequent accurate exposure positions and size on the substrate (wafer). Referring to the top view shown in FIG. 2, the regions in the solid line frames represent active regions 200, and the plurality of overlapping regions between the broken line frames and the solid line frames are frame regions 202, or referred to as dicing lines. For example, the zero layer may be an etched structure formed in the frame region 202 to be used as a mark for alignment. The mark size in this region is large enough to be used for the alignment in all subsequent steps of fabricating the semiconductor device. In another embodiment, the zero layer may be a doping region formed in advance in the substrate and may be used as a deep doping region (e.g., a well region) in the semiconductor device.

In addition, before step S100, it is also possible to confirm whether the initial photomask is for a photolithography process of the zero layer. If it is confirmed that the initial photomask is for the photolithography process of the zero layer, step S100 is performed. If the initial photomask is not for the photolithography process of the zero layer, step S100 may be selectively performed. For example, the photolithography process of the zero layer generally adopts a KrF laser light source (with a wavelength at 248 nm) for performing exposure-development, and the active region mostly adopts an ArF laser light source (with a wavelength at 193 nm) for performing exposure-development. Therefore, the photolithography process of the zero layer is more likely to be subjected to the influence of thermal expansion of the photomask. However, the invention is not limited thereto. The design of the first embodiment is also applicable to a photomask for a photolithography process adopting an ArF laser light source or a non-zero layer photolithography process.

Figure 2:
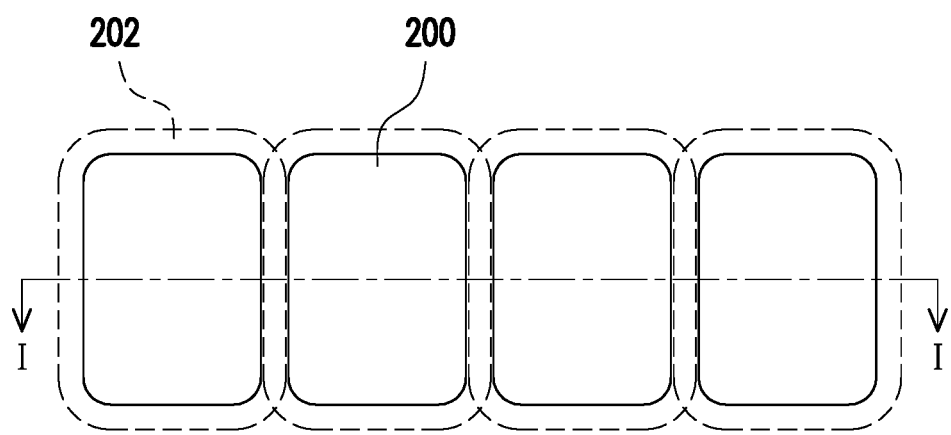
FIG. 2 is a top view of a zero layer disposed on a semiconductor substrate in the first embodiment.
Figure 3A:
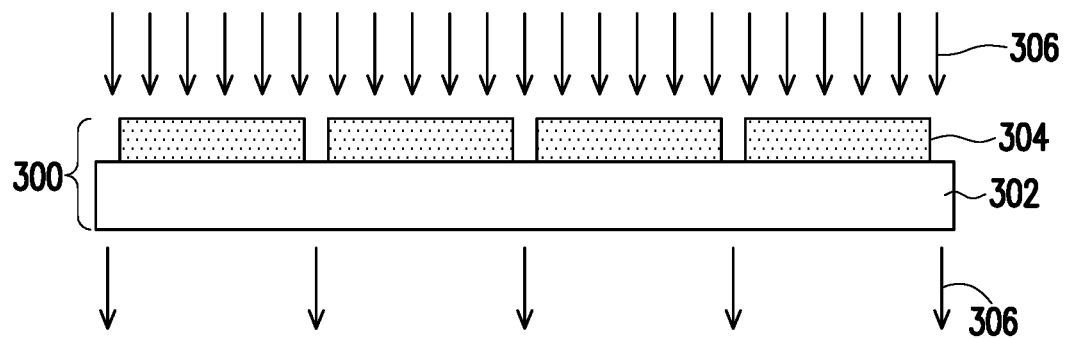
FIG. 3A is a schematic cross-sectional view of the initial photomask corresponding to line I-I of FIG. 2.
Figure 3B:
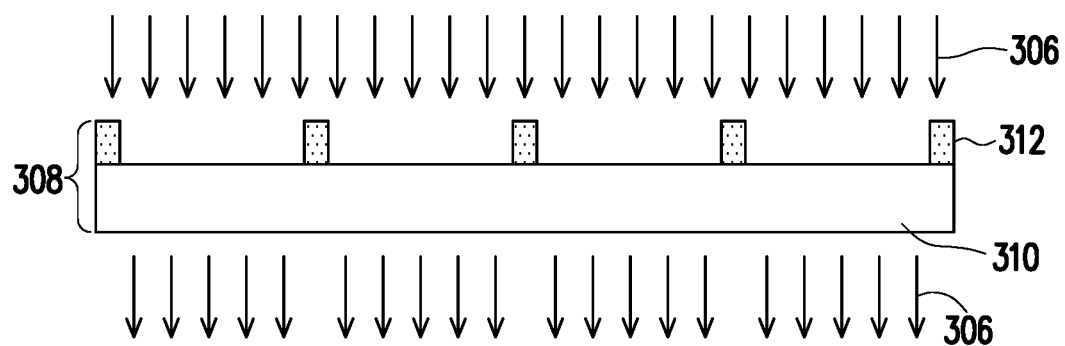
FIG. 3B is a schematic cross-sectional view of the changed photomask corresponding to line I-I of FIG. 2.

To describe the difference before and after the photomask design in more detail, referring to FIG. 3A and FIG. 3B, FIG. 3A is a schematic cross-sectional view of the initial photomask corresponding to line I-I of FIG. 2; and FIG. 3B is a schematic cross-sectional view of the changed photomask corresponding to line I-I of FIG. 2.

In FIG. 3A, an initial photomask 300 includes a transparent substrate 302 and a light shielding layer 304 disposed on the transparent substrate 302. The light shielding layer 304 is, for example, a metal layer (e.g., a Cr layer). The ratio of the area of the light shielding layer 304 to the area of the initial photomask 300 is 75% or more. Therefore, when a laser light source 306 passes through the initial photomask 300, only a small portion of the laser light source 306 penetrates through the transparent substrate 302, and most of the laser light source 306 is absorbed by the light shielding layer 304, which causes the light shielding layer 304 to undergo thermal expansion and affects the size of the exposed region.

In FIG. 3B, a changed photomask 308 similarly includes a transparent substrate 310 and a light shielding layer 312 disposed on the transparent substrate 310. However, since the changed photomask 308 has a reverse tone to the initial photomask 300 of FIG. 3A, the ratio of the area of the light shielding layer 312 to the area of the changed photomask 308 is less than 25%. Therefore, when the laser light source 306 passes through the changed photomask 308, only a small portion of the laser light source 306 is absorbed by the light shielding layer 312, such that the size variation amount of the exposed region can be significantly reduced.

Figure 4A:
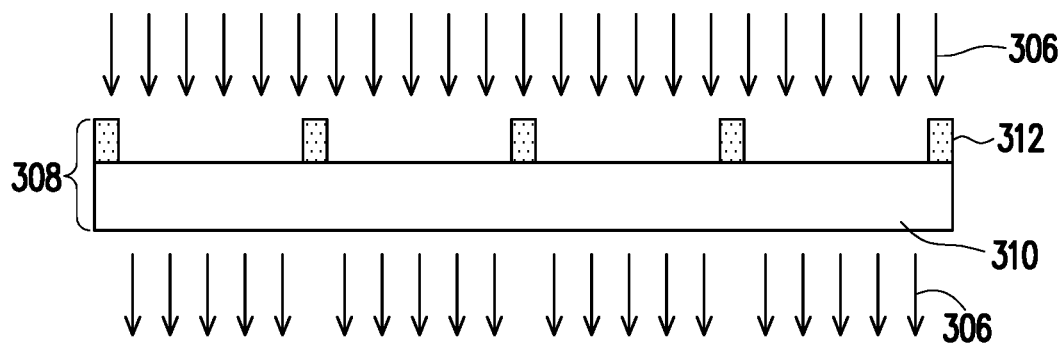
FIG. 4A to FIG. 4C are schematic cross-sectional views showing a semiconductor photolithography process according to a second embodiment of the invention.
Figure 4B:
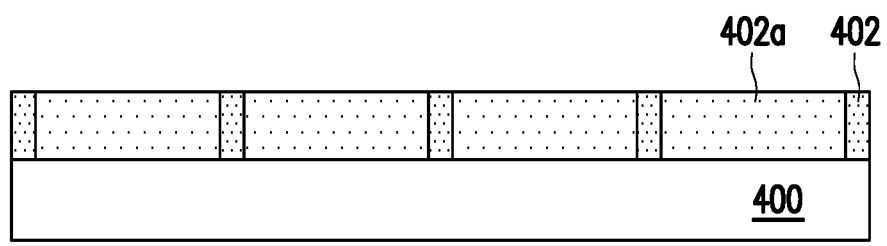
Figure 4C:
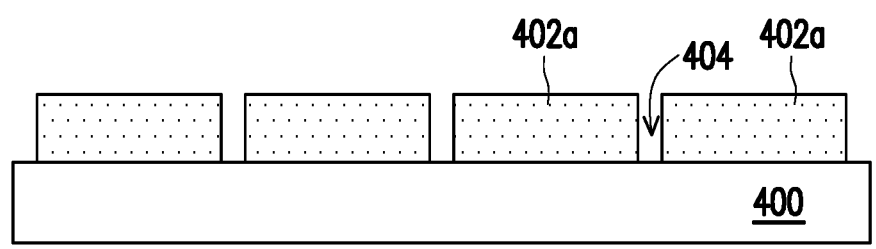

FIG. 4A to FIG. 4C are schematic cross-sectional views showing a semiconductor photolithography process according to a second embodiment of the invention for forming a zero layer on a substrate.

Referring to FIG. 4A, a negative tone resist layer 402 is first formed on a substrate 400, and then the negative tone resist layer 402 is exposed by using the photomask 308 as shown in FIG. 3B.

Next, referring to FIG. 4B, reaction occurs in an irradiated portion 402a of the negative tone resist layer 402, and the irradiated portion 402a will not be removed in the subsequent development step. The unirradiated negative tone resist layer 402 will be removed in the subsequent development step, as shown in FIG. 4C.

Therefore, after the development process, a plurality of regions 404 exposing the substrate 400 are formed between the irradiated portions 402a, and a zero layer is subsequently formed by using different processes. Specifically, the regions 404 correspond to the frame regions 202 of FIG. 2.

Figure 5A:
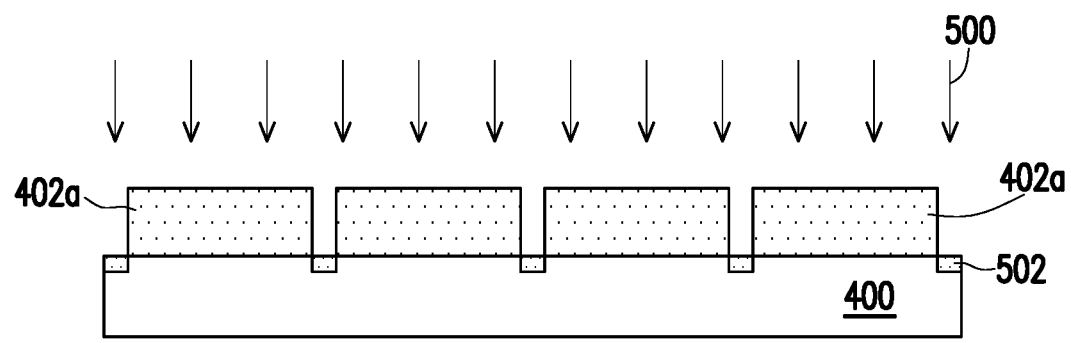
FIG. 5A is a schematic cross-sectional view showing a fabrication process of the zero layer after FIG. 4C.

In an embodiment, a doping process 500 is performed on the substrate 400 by using a negative tone resist layer (e.g., the irradiated portion 402a of FIG. 4C) as the mask to form a plurality of doping regions 502 to be used as a zero layer, as shown in FIG. 5A.

Figure 5B:
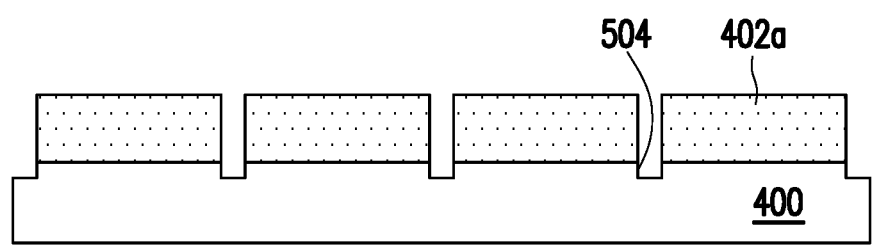
FIG. 5B is a schematic cross-sectional view showing another fabrication process of the zero layer after FIG. 4C.

In another embodiment, the substrate 400 is etched with a negative tone resist layer (e.g., the irradiated portion 402a of FIG. 4C) as the mask to form a plurality of etched structures 504 to be used as a zero layer, as shown in FIG. 5B.

Hereinafter, some experiments are provided to verify the effect of the embodiments of the invention, but the scope of the invention is not limited to the following content.

Comparative Example

A positive tone resist layer was first formed on a wafer. Then, a series of exposures were performed on the positive tone resist layer by using a Canon ES6 KrF scanner with the photomask of FIG. 3A, and the reticle compensation function of the scanner itself was turned off.

Next, after development, the expansion/contraction amount of the pattern on the same lot of wafers in the X direction and the Y direction was respectively measured, and the size variation amount was calculated and recorded in Table 1 below.

Experimental Example 1

The same exposure-development process as in Comparative Example was adopted, but the positive tone resist layer formed on the wafer was changed to a negative tone resist layer, and the photomask of FIG. 3B was used instead. The size variation amount in the X direction and the Y direction was also recorded in Table 1 below.

Experimental Example 2

The same exposure-development process as in Experimental Example 1 was adopted, but the open ratio of the photomask used was different from that in Experimental Example 1. The size variation amount in the X direction and the Y direction was also recorded in Table 1 below.

TABLE 1

|  | Open ratio | X-direction size variation amount | Y-direction size variation amount |
| --- | --- | --- | --- |
| Comparative Example | ~0.01% | 0.38 ppm | 0.46 ppm |
| Experimental Example 1 | 77% | 0.1 ppm | 0.2 ppm |
| Experimental Example 2 | 97.74% | 0.12 ppm | 0.04 ppm |

As can be seen from Table 1, the method of the invention can significantly reduce the size variation amount, and the results of either Experimental Example 1 or Experimental Example 2 are obviously better than those of Comparative Example.

In view of the foregoing, by changing the design of the photomask, the invention can reduce the influence of thermal expansion on the photomask and reduce the size variation amount of the exposed pattern to thereby increase the precision of the semiconductor photolithography process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for designing a photomask, comprising:
   calculating an open ratio of an initial photomask to determine whether the open ratio of the initial photomask is less than 25%; and
   in response to determining the open ratio is less than 25%, changing a design of the initial photomask, such that a changed photomask has a reverse tone to the design of the initial photomask, and an open ratio of the changed photomask is 75% or more.

2. The method for designing a photomask according to claim 1, wherein the initial photomask is adapted to expose a positive tone resist, and the changed photomask is adapted to expose a negative tone resist.

3. The method for designing a photomask according to claim 1, wherein before the step of calculating the open ratio of the initial photomask, the method further comprises confirming whether the initial photomask is for a photolithography process of a zero layer, and in response to confirming that the initial photomask is for the photolithography process of the zero layer, the calculation is performed.

4. The method for designing a photomask according to claim 3, wherein the zero layer comprises a doping region or an etched structure.

5. The method for designing a photomask according to claim 1, wherein the changed photomask comprises a transparent substrate and a light shielding layer disposed on the transparent substrate, and a ratio of an area of the light shielding layer to an area of the changed photomask is less than 25%.

6. The method for designing a photomask according to claim 5, wherein the light shielding layer comprises a metal layer.

* * * * *